(12) United States Patent
Kagaya

(10) Patent No.: US 12,618,156 B2
(45) Date of Patent: May 5, 2026

(54) ATOMIC LAYER DEPOSITION OF SILICON NITRIDE FILM USING HELIUM GAS PLASMA

(71) Applicant: Tokyo Electron Limited, Tokyo (JP)

(72) Inventor: Munehito Kagaya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 765 days.

(21) Appl. No.: 17/756,094

(22) PCT Filed: Nov. 12, 2020

(86) PCT No.: PCT/JP2020/042215
§ 371 (c)(1),
(2) Date: May 17, 2022

(87) PCT Pub. No.: WO2021/100594
PCT Pub. Date: May 27, 2021

(65) Prior Publication Data
US 2022/0403515 A1     Dec. 22, 2022

(30) Foreign Application Priority Data

Nov. 19, 2019     (JP) .................................. 2019-209033

(51) Int. Cl.

| | |
|---|---|
| *C23C 16/34* | (2006.01) |
| *C23C 16/44* | (2006.01) |
| *C23C 16/455* | (2006.01) |
| *C23C 16/505* | (2006.01) |
| *C23C 16/52* | (2006.01) |
| *H01J 37/32* | (2006.01) |
| *H01L 21/02* | (2006.01) |

(52) U.S. Cl.
CPC ...... *C23C 16/45542* (2013.01); *C23C 16/345* (2013.01); *C23C 16/4408* (2013.01); *C23C 16/45565* (2013.01); *C23C 16/505* (2013.01); *C23C 16/52* (2013.01); *H01J 37/32449* (2013.01); *H01L 21/0217* (2013.01); *H01L 21/02274* (2013.01); *H01L 21/0228* (2013.01); *H01J 37/32082* (2013.01); *H01J 2237/332* (2013.01); *H01L 21/02211* (2013.01)

(58) Field of Classification Search
CPC ............ C23C 16/45542; C23C 16/345; C23C 16/4408; C23C 16/45565; C23C 16/505
See application file for complete search history.

(56) References Cited

U.S. PATENT DOCUMENTS

| | | | | |
|---|---|---|---|---|
| 8,647,993 | B1 * | 2/2014 | LaVoie ................ | H01L 21/0217 438/791 |
| 9,214,333 | B1 * | 12/2015 | Sims ........................ | C23C 16/52 |
| 9,576,792 | B2 * | 2/2017 | Chen ................. | C23C 16/45553 |
| 10,453,675 | B2 * | 10/2019 | O'Neill ............... | H01L 21/0214 |
| 2015/0087139 | A1 * | 3/2015 | O'Neill ............. | H01L 21/02598 438/789 |
| 2017/0186606 | A1 * | 6/2017 | Fukiage .............. | C23C 16/0209 |
| 2019/0237326 | A1 * | 8/2019 | Komiya ............ | H01J 37/32201 |
| 2022/0411920 | A1 * | 12/2022 | Kagaya ................. | C23C 16/505 |
| 2025/0118550 | A1 * | 4/2025 | Kagaya ............... | H01L 21/0217 |

FOREIGN PATENT DOCUMENTS

| | | | | |
|---|---|---|---|---|
| JP | 2016-066794 A | | 4/2016 | |
| JP | 2018-528615 | * | 9/2018 | |
| JP | 2018-534772 | * | 11/2018 | .......... H01L 21/316 |
| KR | 10-2015-0060592 A | | 6/2015 | |
| KR | 10-2016-0035991 A | | 4/2016 | |

OTHER PUBLICATIONS

Kwon, Jung-Dae, et al., "Effects of helium concentration on microcrystalline silicon thin film solar cells deposited by atmospheric-pressure plasma deposition at 13.3kPa". Thin Solid Films, 650 (2018) 32-36.*
Meng, Xin, et al., "Atomic Layer Deposition of Silicon Nitride Thin Films: A Review of Recent Progress, Challenges, and Outlooks". Materials, 2016, 9, 1007, pp. 1-20.*
Martirosyan, Vahagn, et al., "Helium plasma modification of Si and Si3 N4 thin films for advanced etch processes". J. Vac. Sci. Technol. A 36, 041301 (2018) pp. 1-9.*

* cited by examiner

*Primary Examiner* — Bret P Chen
(74) *Attorney, Agent, or Firm* — Armstrong Teasdale LLP

(57) ABSTRACT

A substrate processing method includes forming an adsorption layer on a substrate by supplying a silicon-containing gas to the substrate; performing a modification by generating plasma containing He; and generating plasma of a reaction gas to cause the plasma to react with the adsorption layer, wherein the forming the adsorption layer, the performing the modification, and the generating the plasma are repeated to form a silicon-containing film.

10 Claims, 5 Drawing Sheets

ATOMIC LAYER DEPOSITION OF SILICON NITRIDE FILM USING HELIUM GAS PLASMA

CROSS-REFERENCE TO RELATED APPLICATIONS

The present application is a U.S. National Stage Entry of International Patent Application No. PCT/JP2020/042215, filed Nov. 12, 2020, which claims the benefit of priority to Japanese Patent Application No. 2019-209033, filed Nov. 19, 2019, each of which is hereby incorporated herein by reference in its entirety.

TECHNICAL FIELD

The present disclosure relates to a substrate processing method and a substrate processing apparatus.

BACKGROUND

A SiN film is formed by, for example, an ALD method using plasma. A low wet etching rate is required for the SiN film.

Patent Document 1 discloses a method of forming a SiN film in which adsorbing a film precursor containing Si on a semiconductor substrate, exposing the adsorbed film precursor to plasma containing N-containing ions and/or radicals to form a SiN coating film layer, and increasing the density of the SiN film layer by exposing plasma containing He to the SiN film layer are repeated.

PRIOR ART DOCUMENT

[Patent Document]
Patent Document 1: Japanese Patent Publication No. 2016-066794

SUMMARY

However, a modifying process using the He gas plasma disclosed in Patent Document 1 has a problem in that a film formation rate is reduced.

In an aspect, the present disclosure provides a substrate processing method and a substrate processing apparatus that improve a film formation rate.

In view of the foregoing, according to an aspect, there is provided a substrate processing method which includes forming an adsorption layer on a substrate by supplying a silicon-containing gas to the substrate; performing a modification by generating a He-containing plasma; and generating plasma of a reaction gas to cause the plasma to react with the adsorption layer, wherein the forming the adsorption layer, the performing the modification, and the generating the plasma are repeated to form a silicon-containing film.

According to an aspect, it is possible to provide a substrate processing method and a substrate processing apparatus that improve a film formation rate.

DETAILED DESCRIPTION

Figure 1:
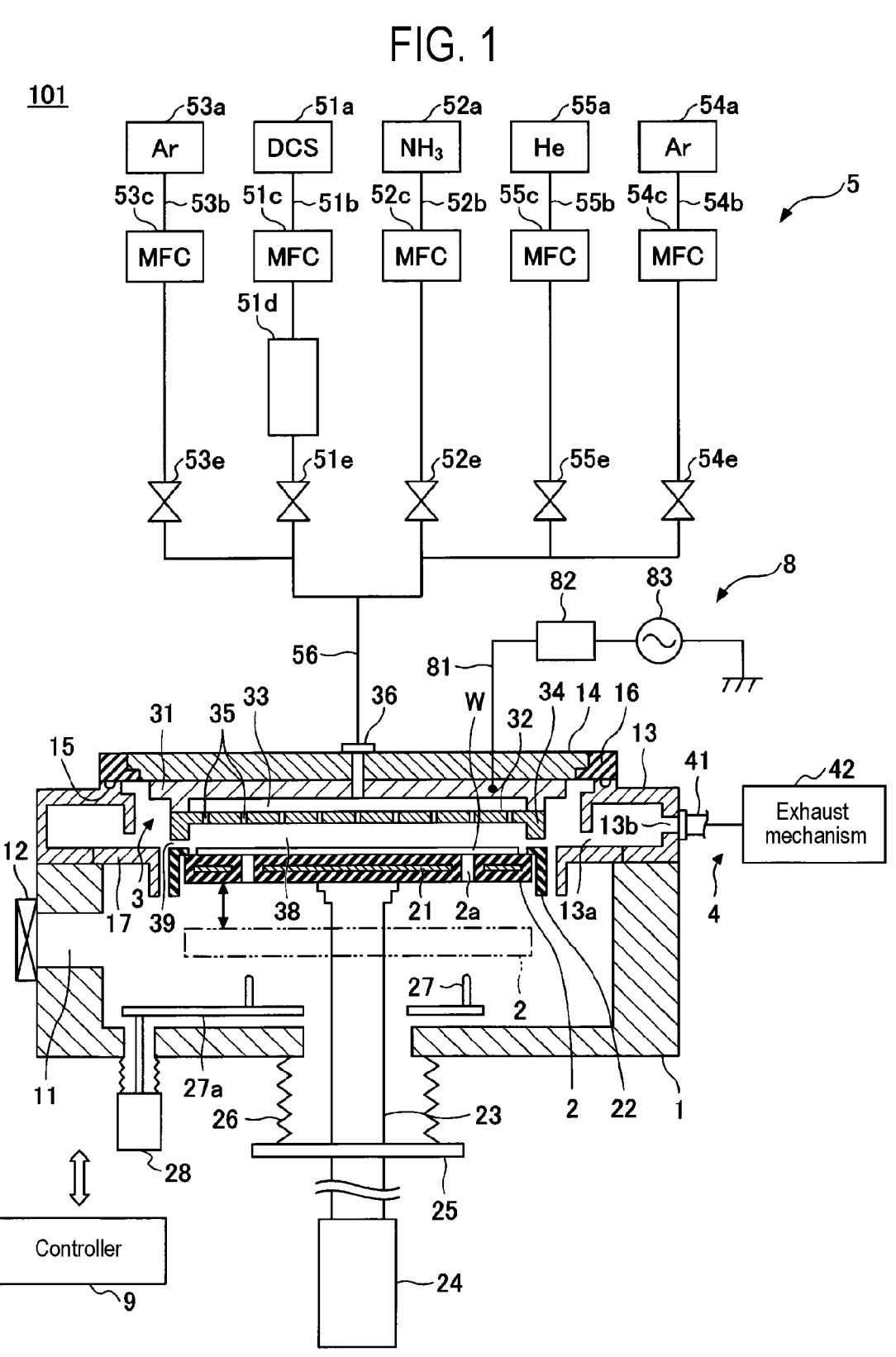
FIG. 1 is a schematic view illustrating a configuration example of a substrate processing apparatus.

Hereinafter, embodiments of the present disclosure will be described with reference to the accompanying drawings. In each of the drawings, the same components will be denoted by the same reference numerals, and redundant descriptions thereof may be omitted.

[Substrate Processing Apparatus]

A substrate processing apparatus 101 according to an embodiment will be described with reference to FIG. 1. FIG. 1 is a schematic view illustrating a configuration example of the substrate processing apparatus 101. The substrate processing apparatus 101 forms a SiN film by a plasma enhanced atomic layer deposition (PE-ALD) method within a processing container maintained in a depressurized state.

As illustrated in FIG. 1, the substrate processing apparatus 101 includes a processing container 1, a stage 2, a shower head 3, an exhauster 4, a gas supply mechanism 5, an RF power supply 8, and a controller 9.

The processing container 1 is made of a metal such as aluminum, and has a substantially cylindrical shape. The processing container 1 accommodates a wafer W. A carry-in/out port 11 for carrying in or carrying out the wafer W therethrough is formed in the sidewall of the processing container 1. The carry-in/out port 11 is opened/closed by a gate valve 12. An annular exhaust duct 13 having a rectangular cross section is provided on a main body of the processing container 1. A slit 13a is formed along an inner peripheral surface of the exhaust duct 13. An exhaust port 13b is formed in an outer wall of the exhaust duct 13. On a top surface of the exhaust duct 13, a ceiling wall 14 is provided to close an upper opening of the processing container 1 via an insulator member 16. A space between the exhaust duct 13 and the insulator member 16 is hermetically sealed with a seal ring 15. A partition member 17 partitions the interior of the processing container 1 into upper and lower portions when the stage 2 (and a cover member 22) is raised to a processing position (to be described later).

The stage 2 horizontally supports the wafer W inside the processing container 1. The stage 2 is formed in a disk shape having a size corresponding to the wafer W, and is supported by a support member 23. The stage 2 is formed of a ceramic material such as AlN or a metallic material such as aluminum or a nickel alloy. A heater 21 for heating the wafer W is embedded in the stage 2. The heater 21 generates heat by being fed with power from a heater power supply (not illustrated). In addition, the wafer W is controlled to have a predetermined temperature by controlling the output of the heater 21 by a temperature signal of a thermocouple (not illustrated) provided in the vicinity of the top surface of the stage 2. The cover member 22 formed of ceramic, such as alumina, is provided on the stage 2 to cover an outer peripheral region of the top surface and a side surface of the stage 2.

The support member 23 that supports the stage 2 is provided on the bottom surface of the stage 2. The support member 23 extends from the center of the bottom surface of the stage 2 downward of the processing container 1 through a hole formed in the bottom wall of the processing container 1. A lower end of the support member 23 is connected to a lifting mechanism 24. By the lifting mechanism 24, the stage 2 is raised and lowered between a processing position illustrated in FIG. 1 and a transfer position indicated by the alternate long and two short dash line below the processing position through the support member 23. At the transfer position, the wafer W is capable of being transferred. A flange 25 is provided on the support member 23 below the processing container 1. A bellows 26, which is configured to isolate an internal atmosphere of the processing container 1 from ambient air and to be flexible with the vertical movement of the stage 2, is provided between the bottom surface of the processing container 1 and the flange 25.

Three wafer support pins 27 (of which only two are illustrated) are provided in the vicinity of the bottom surface of the processing container 1 to protrude upward from a lifting plate 27*a*. The wafer support pins 27 are moved upward and downward via the lifting plate 27*a* by a lifting mechanism 28 provided below the processing container 1. The wafer support pins 27 are inserted through respective through-holes 2*a* provided in the stage 2 located at the transfer position and are configured to move upward and downward with respect to the top surface of the stage 2. By raising/lowering the wafer support pins 27, the wafer W is delivered between a wafer transfer mechanism (not illustrated) and the stage 2.

The shower head 3 supplies a processing gas into the processing container 1 in the form of a shower. The shower head 3 is made of a metal and provided to face the stage 2, and has a diameter, which is substantially equal to that of the stage 2. The shower head 3 includes a main body 31 fixed to the ceiling wall 14 of the processing container 1 and a shower plate 32 connected to the lower side of the main body 31. A gas diffusion space 33 is formed between the main body 31 and the shower plate 32, and is provided with a gas introduction hole 36 to penetrate the centers of the ceiling wall 14 of the processing container 1 and the main body 31. An annular protrusion 34 protruding downward is formed on a peripheral edge portion of the shower plate 32. Gas ejection holes 35 are formed in a flat surface inside the annular protrusion 34. In the state in which the stage 2 is located at the processing position, a processing space 38 is formed between the stage 2 and the shower plate 32, and the top surface of the cover member 22 and the annular protrusion 34 are close to each other to form an annular gap 39.

The exhauster 4 exhausts the interior of the processing container 1. The exhauster 4 includes an exhaust pipe 41 connected to the exhaust port 13*b*, and an exhaust mechanism 42, which is connected to the exhaust pipe 41 and includes a vacuum pump, a pressure control valve, and the like. During a process, the gas in the processing container 1 reaches the exhaust duct 13 via the slit 13*a*, and is exhausted from the exhaust duct 13 through the exhaust pipe 41 by the exhaust mechanism 42.

The gas supply mechanism 5 supplies a processing gas into the processing container 1. The gas supply mechanism 5 includes a precursor gas source 51*a*, a reaction gas source 52*a*, an Ar gas source 53*a*, an Ar gas source 54*a*, and a He gas source 55*a*.

The precursor gas source 51*a* supplies a precursor gas into the processing container 1 through a gas supply line 51*b*. In the example illustrated in FIG. 1, a dichlorosilane (DCS) gas is used as the precursor gas. In the gas supply line 51*b*, a flow rate controller 51*c*, a storage tank 51*d*, and a valve 51*e* are interposed from an upstream side. A downstream side of the valve 51*e* of the gas supply line 51*b* is connected to the gas introduction hole 36 through the gas supply line 56. The precursor gas supplied from the precursor gas source 51*a* is temporarily stored in the storage tank 51*d* before being supplied into the processing container 1, is boosted to a predetermined pressure inside the storage tank 51*d*, and is then supplied into the processing container 1. The supply and cutoff of the precursor gas from the storage tank 51*d* to the processing container 1 are performed by opening/closing the valve 51*e*. By temporarily storing the precursor gas inside the storage tank 51*d* as described above, it is possible to stably supply the precursor gas into the processing container 1 at a relatively large flow rate.

The reaction gas source 52*a* supplies a reaction gas into the processing container 1 through a gas supply line 52*b*. In the example illustrated in FIG. 1, a $NH_3$ gas is used as the reaction gas. In the gas supply line 52*b*, a flow rate controller 52*c* and a valve 52*e* are interposed from an upstream side. A downstream side of the valve 52*e* of the gas supply line 52*b* is connected to the gas introduction hole 36 through the gas supply line 56. The reaction gas supplied from the reaction gas source 52*a* is supplied into the processing container 1. The supply and cutoff of the reaction gas to the processing container 1 are performed by opening/closing the valve 52*e*.

The Ar gas source 53*a* supplies an Ar gas as a purge gas into the processing container 1 through a gas supply line 53*b*. In the gas supply line 53*b*, a flow rate controller 53*c* and a valve 53*e* are interposed from an upstream side. A downstream side of the valve 53*e* of the gas supply line 53*b* is connected to the gas supply line 51*b*. The Ar gas supplied from the Ar gas source 53*a* is supplied into the processing container 1. The supply and cutoff of the Ar gas to the processing container 1 are performed by opening/closing the valve 53*e*.

The Ar gas source 54*a* supplies an Ar gas as a purge gas into the processing container 1 through a gas supply line 54*b*. In the gas supply line 54*b*, a flow rate controller 54*c* and a valve 54*e* are interposed from an upstream side. A downstream side of the valve 54*e* of the gas supply line 54*b* is connected to the gas supply line 52*b*. The Ar gas supplied from the Ar gas source 54*a* is supplied into the processing container 1. The supply and cutoff of the Ar gas to the processing container 1 are performed by opening/closing the valve 54*e*.

The He gas source 55*a* supplies He gas as a modifying gas for modifying a film into the processing container 1 through a gas supply line 55*b*. In the gas supply line 55*b*, a flow rate controller 55*c* and a valve 55*e* are interposed from an upstream side. A downstream side of the valve 55*e* of the gas supply line 55*b* is connected to the gas supply line 52*b*. The He gas supplied from the He gas source 55*a* is supplied into the processing container 1. The supply and cutoff of the He gas to the processing container 1 are performed by opening/closing the valve 55*e*.

In addition, the substrate processing apparatus 101 is a capacitively coupled plasma apparatus, in which the stage 2 serves as a lower electrode and the shower head 3 serves as an upper electrode. The stage 2 serving as the lower electrode is grounded via a capacitor (not illustrated).

Radio-frequency power (hereinafter, also referred to as "RF power") is applied to the shower head 3 serving as the upper electrode by the RF power supply 8. The RF power supply 8 includes a feeding line 81, a matcher 82, and a radio-frequency power source 83. The radio-frequency power source 83 is a power source that generates radio-frequency power. The radio-frequency power has a frequency suitable for plasma generation. A frequency of the radio-frequency power is, for example, a frequency in the range of 450 KHz to 100 MHz. The radio-frequency power source 83 is connected to the main body 31 of the shower head 3 via the matcher 82 and the feeding line 81. The matcher 82 includes a circuit for matching an output reactance of the radio-frequency power source 83 and a reactance of a load (the upper electrode). Although the RF power supply 8 has been described as applying the radio-frequency power to the shower head 3 serving as the upper electrode, the present disclosure is not limited thereto. The RF power supply 8 may be configured to apply the radio-frequency power to the stage 2 serving as the lower electrode.

The controller 9 is, for example, a computer, and includes a central processing unit (CPU), a random access memory (RAM), a read only memory (ROM), an auxiliary storage device, and the like. The CPU operates based on a program stored in the ROM or the auxiliary storage device and controls the operation of the substrate processing apparatus 101. The controller 9 may be provided either inside or outside the substrate processing apparatus 101. In the case in which the controller 9 is provided outside the substrate processing apparatus 101, the controller 9 is capable of controlling the substrate processing apparatus 101 through a wired or wireless communication mechanism.

[Film Forming Process Using Substrate Processing Apparatus]

Figure 2:
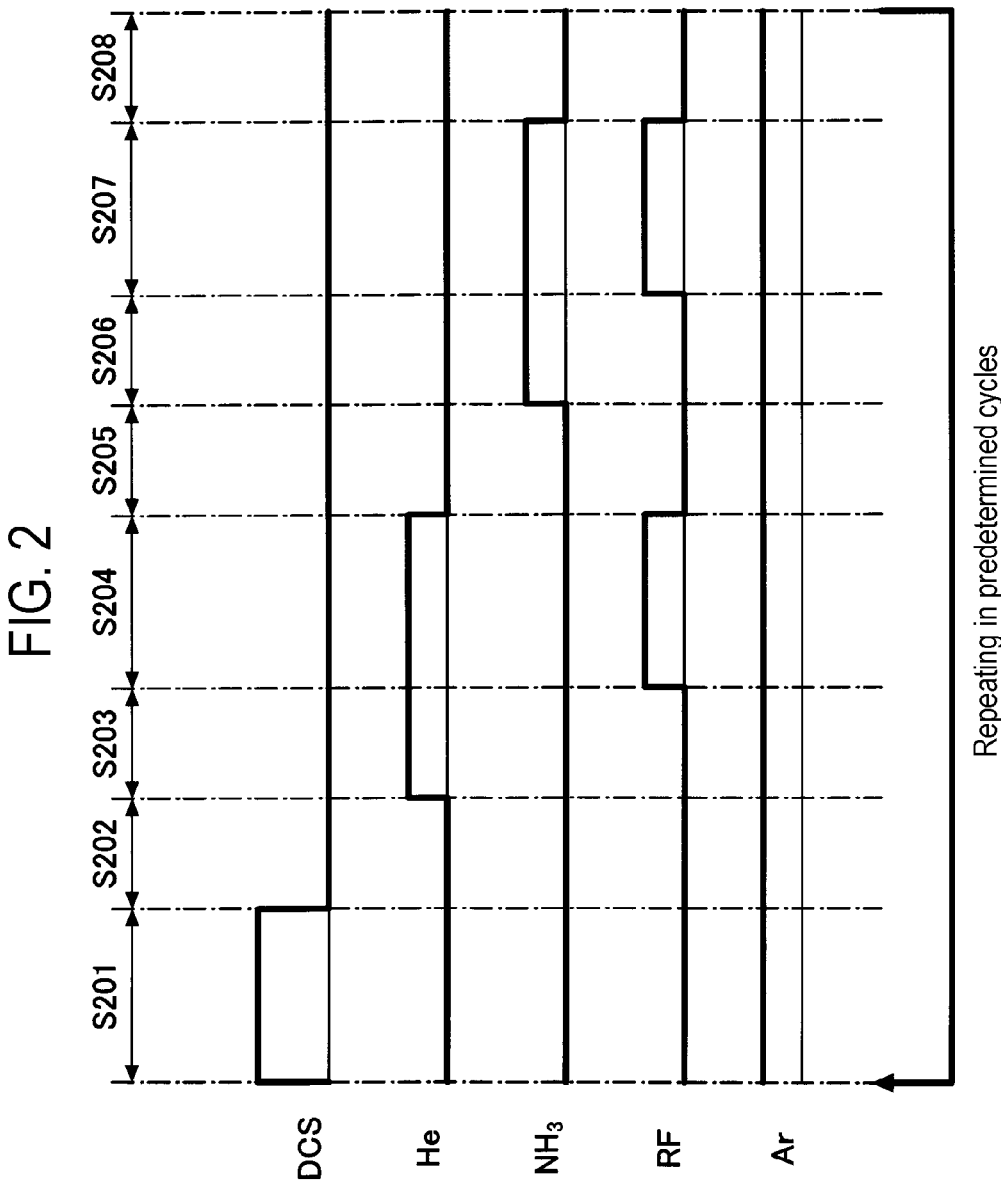
FIG. 2 is a time chart illustrating an example of an operation of the substrate processing apparatus according to the present example.

Next, an example of an operation of the substrate processing apparatus 101 will be described with reference to FIG. 2. FIG. 2 is a time chart illustrating the example of the operation of the substrate processing apparatus 101 according to the present example. The substrate processing apparatus 101 forms a SiN film on which a base film is formed, by a PE-ALD process.

The PE-ALD process illustrated in FIG. 2 is a process of repeating a precursor gas supply step S201, a purging step S202, a He gas supply step S203, an RF power application step S204, a purging step S205, a reaction gas supply step S206, an RF gas application step S207, and a purging step S208 in predetermined cycles to alternately supply a precursor gas and a reaction gas and form a SiN film having a desired film thickness on the wafer W. In FIG. 2, only one cycle is illustrated.

The precursor gas supply step S201 is a step of supplying the precursor gas to the processing space 38. In the precursor gas supply step S201, first, in the state in which the valves 53e and 54e are opened, the Ar gas is supplied from the Ar gas sources 53a and 54a via the gas supply lines 53b and 54b. In addition, by opening the valve 51e, the precursor gas is supplied to the processing space 38 inside the processing container 1 from the precursor gas source 51a via the gas supply line 51b. In this case, the precursor gas is temporarily stored in the storage tank 51d and then supplied into the processing container 1. As a result, the precursor is adsorbed on the surface of the wafer W so that an adsorption layer of the precursor is formed on the surface of the wafer W.

The purging step S202 is a step of purging the excess precursor gas or the like in the processing space 38. In the purging step S202, the valve 51e is closed to stop the supply of the precursor gas while the supply of the Ar gas via the gas supply lines 53b and 54b is continued. As a result, the Ar gas is supplied to the processing space 38 inside the processing container 1 from the Ar gas sources 53a and 54a via the gas supply lines 53b and 54b. As a result, the excess precursor gas or the like in the processing space 38 is purged. By closing the valve 51e, the storage tank 51d is filled with the precursor gas.

The He gas supply step S203 is a step of supplying the He gas to the processing space 38. In the He gas supply step S203, the valve 55e is opened while the supply of the Ar gas via the gas supply lines 53b and 54b is continued. As a result, the He gas is supplied to the processing space 38 from the He gas source 55a via the gas supply line 55b.

The RF power application step S204 is a step of exciting the He gas to plasma. In the RF power application step S204, the plasma is generated in the processing space 38 by applying RF to the upper electrode by the radio-frequency power source 83 while the supply of the Ar gas via the gas supply lines 53b and 54b and the supply of the He gas via the gas supply line 55b are continued. As a result, the adsorption layer on the surface of the wafer W is modified.

The purging step S205 is a step of purging the He gas or the like in the processing space 38. In the purging step S205, the valve 55e is closed to stop the supply of the He gas while the supply of the Ar gas via the gas supply lines 53b and 54b is continued. In addition, the radio-frequency power source 83 stops applying RF to the upper electrode. As a result, the Ar gas is supplied to the processing space 38 inside the processing container 1 from the Ar gas sources 53a and 54a via the gas supply lines 53b and 54b. As a result, the He gas and the like in the processing space 38 are purged.

The reaction gas supply step S206 is a step of supplying the $NH_3$ gas as a reaction gas. In the reaction gas supply step S206, the valve 55e is closed to stop the supply of the He gas and the valve 52e is opened while the supply of the Ar gas via the gas supply lines 53b and 54b is continued. As a result, the reaction gas is supplied to the processing space 38 from the reaction gas source 52a via the gas supply line 52b.

The RF power application step S207 is a step of exciting the $NH_3$ gas supplied as a reaction gas to plasma. In the RF power application step S207, the plasma is generated in the processing space 38 by applying RF to the upper electrode by the radio-frequency power source 83 while the supply of the Ar gas via the gas supply lines 53b and 54b and the supply of the reaction gas via the gas supply line 52b are continued. As a result, the adsorption layer on the surface of the wafer W is nitrided to generate the SiN film.

The purging step S208 is a step of purging the excess reaction gas or the like in the processing space 38. In the purging step S208, the valve 52e is closed to stop the supply of the reaction gas while the supply of the Ar gas via the gas supply lines 53b and 54b is continued. In addition, the radio-frequency power source 83 stops applying RF to the upper electrode. As a result, the Ar gas is supplied to the processing space 38 inside the processing container 1 from the Ar gas sources 53a and 54a via the gas supply lines 53b and 54b. As a result, the excess reaction gas and the like in the processing space 38 are purged.

By repeating the above cycle, the SiN film is formed in conformity to an uneven pattern formed on the wafer W.

Here, a preferable range of conditions under which the SiN film is formed using the DCS gas and the $NH_3$ gas in step S101 are shown below.

Temperature: 250 to 600 degrees C.

Pressure: 0.5 to 10 Torr

Flow rate of DCS gas: 10 to 100 cc/cycle

Flow rate of $NH_3$ gas: 500 to 10,000 sccm

Flow rate of He gas: 100 to 10,000 sccm

Flow rate of Ar gas: 500 to 10,000 sccm

Time required for step (S201): 0.05 to 2.0 sec

Time required for step (S202): 0.1 to 2.0 sec

Time required for step (S203): 0.0 to 2.0 sec

Time required for step (S204): 1.0 to 6.0 sec

Time required for step (S205): 0.0 to 2.0 sec

Time required for step (S206): 0.5 to 2.0 sec

Time required for step (S207): 1.0 to 6.0 sec

Time required for step (S208): 0.1 to 2.0 sec

RF power during modification (S204): 10 to 1,000 W

RF power during nitration (S207): 50 to 1,000 W

Further, the precursor gas purging step S202 may be omitted, or the modifying steps S203 and S204 using the He plasma may be performed after the precursor gas supply step S201. In addition, the He gas may be supplied simultaneously in a step other than step S207.

Figure 3:
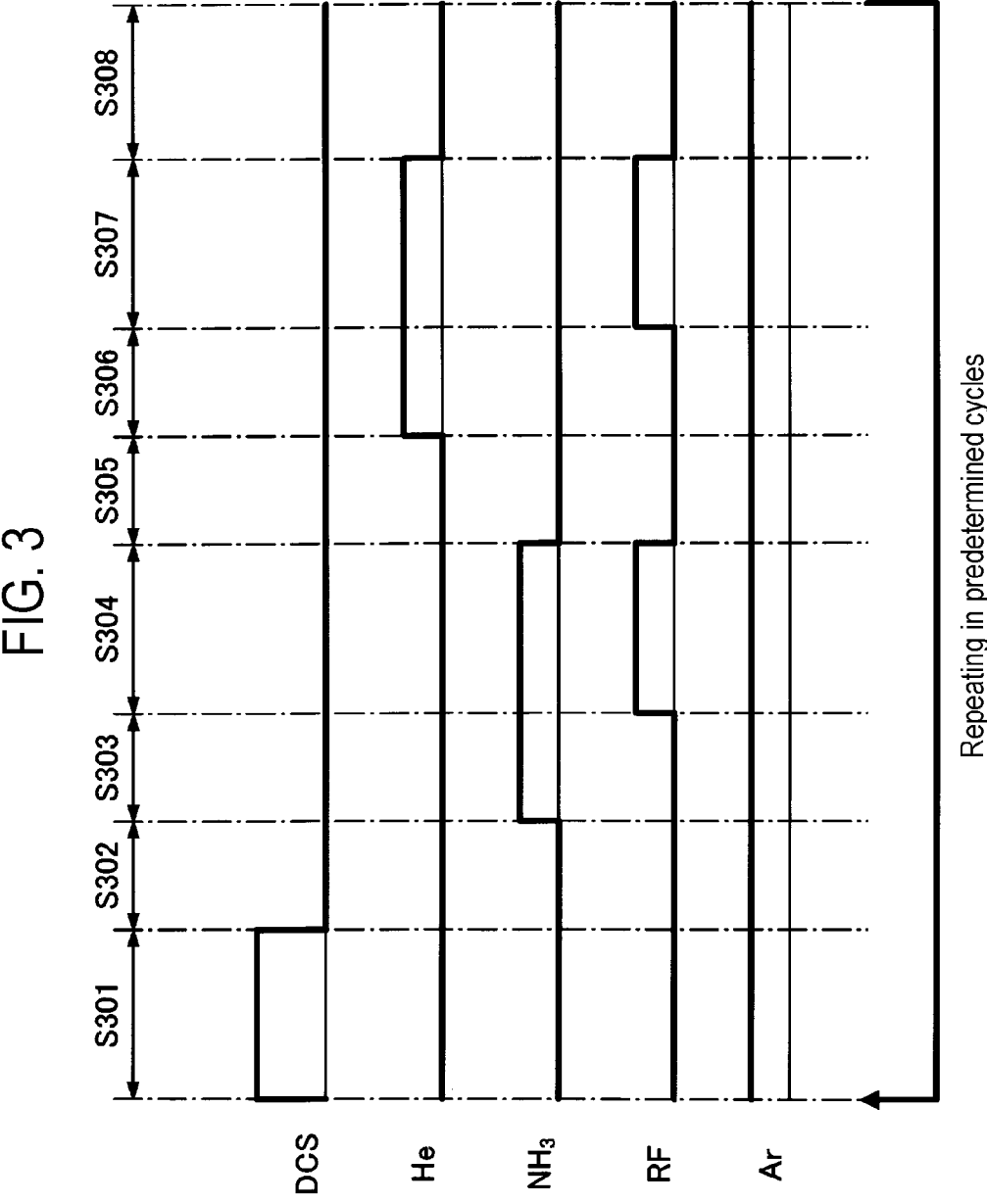
FIG. 3 is a time chart illustrating an example of an operation of a substrate processing apparatus according to a reference example.

Next, an example of an operation of a substrate processing apparatus according to a reference example will be described with reference to FIG. 3. The substrate processing apparatus according to the reference example has the same configuration as the substrate processing apparatus 101 according to the present example illustrated in FIG. 1, and thus the description thereof will be omitted. FIG. 3 is a time chart illustrating an example of the operation of the substrate processing apparatus according to the reference example. In the substrate processing apparatus according to the reference example, a SiN film is formed on the wafer W on which a base film is formed, by a PE-ALD process.

The PE-ALD process illustrated in FIG. 3 is a process of repeating a precursor gas supply step S301, a purging step S302, a reaction gas supply step S303, an RF power application step S304, a purging step S305, a He gas supply step S306, an RF gas application step S307, and a He gas purging step S308 in predetermined cycles to alternately supply a precursor gas and a reaction gas and form the SiN film having a desired film thickness on the wafer W. In FIG. 3, only one cycle is illustrated.

That is, in the process (see FIG. 2) in the substrate processing apparatus 101 according to the present example, after the adsorption of the precursor gas (S201) and before the nitriding process (S206 and S207), a modifying process using He gas plasma (S203 and S204) is performed.

In contrast, in the process (see FIG. 3) in the substrate processing apparatus according to the reference example, after the adsorption of the precursor (S301) and the nitriding process (S303 and S304), a modifying process using the He gas plasma (S306 and S307) is performed. The process in each step is the same as in the case of the process illustrated in FIG. 2, and the description thereof will be omitted.

Figure 4:
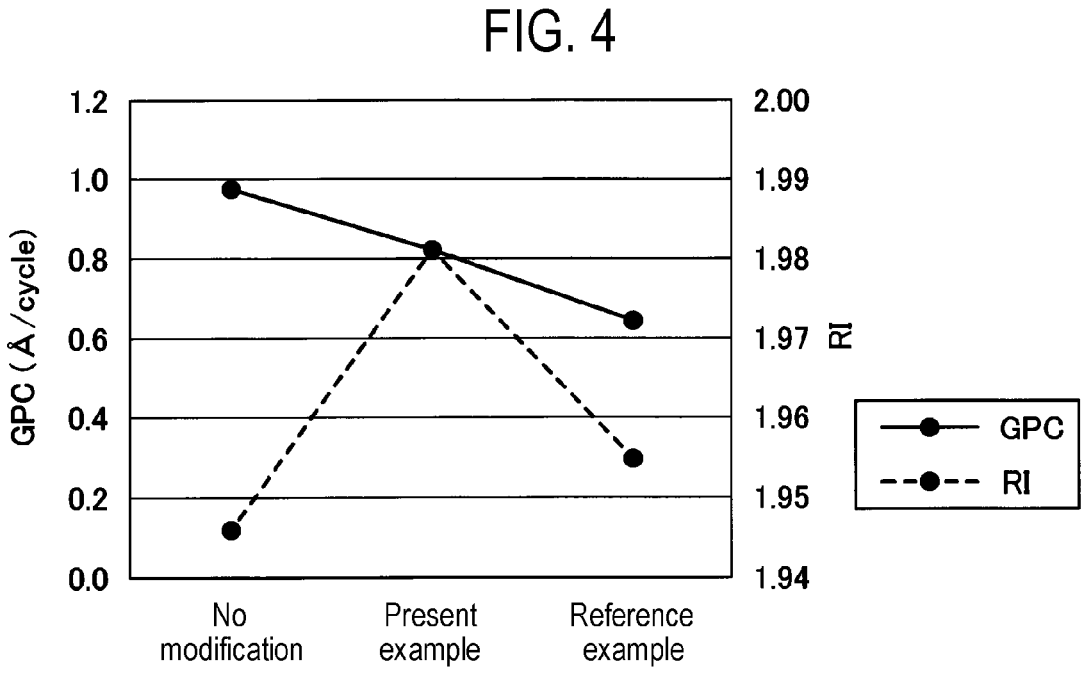
FIG. 4 is a graph showing an example of comparison between film qualities of a SiN film of the present example, a SiN film of the reference example, and a SiN film in a case of no modification.

FIG. 4 is a graph showing an example of comparison between film qualities of the SiN film of the present example, the SiN film of the reference example, and a SiN film in a case of no modification. Here, in the "Present example" at the center, the SiN film was formed by the process illustrated in FIG. 2. In "Reference example" on the right, the SiN film was formed by the process shown in FIG. 3. In "No modification" on the left, the SiN film was formed without performing a modifying process by plasma of a modifying gas (that is, in the process of FIGS. 3, S306 and S307 are omitted and steps S301 to S305 are repeated).

In the graph shown in FIG. 4, the first vertical axis on the left side represents a film formation rate (growth per cycle: GPC), which is indicated by a solid line. The second vertical axis on the right side represents a refractive index (RI), which is indicated by a broken line.

Figure 5:
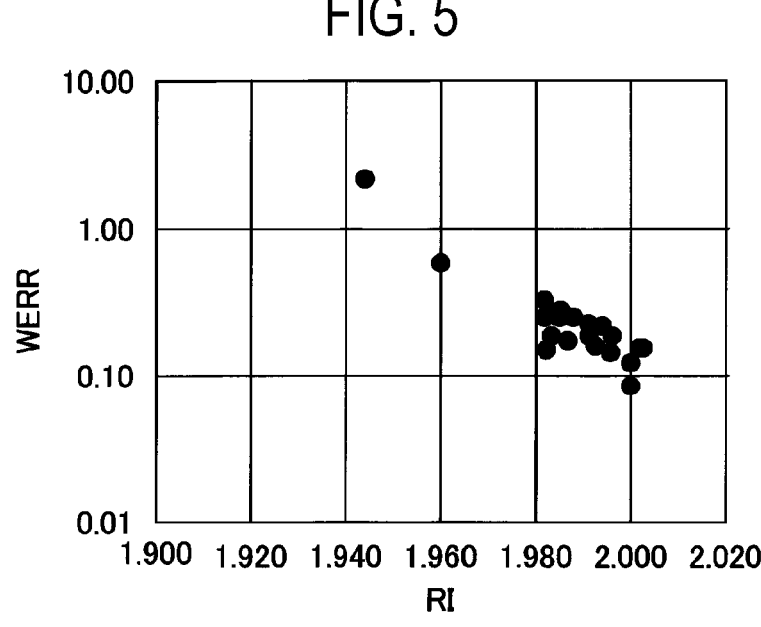
FIG. 5 is a graph showing an example of a relationship between a WERR and an RI.

As shown in the graph of the broken line, the RI is improved in both the present example and the reference example compared with the case of no modification. Here, FIG. 5 is a graph showing an example of a relationship between a wet etching rate ratio (WERR) and an RI with respect to a thermal oxide film. As shown in FIG. 5, the WERR and the RI have a negative correlation. Therefore, in the present example and the reference example, the etching rate is lowered, that is, the etching resistance is improved compared with the case of no modification. In addition, in the present example, the wet etching resistance is further improved compared with the reference example.

In addition, as indicated by the solid line in the graph, the film formation rate is reduced in the reference example compared with the case of no modification. In contrast, in the present example, it is possible to suppress a decrease in the film formation rate. That is, in the present example, the film formation rate can be improved compared with the reference example.

Here, modifying effects using the He gas plasma will be described with reference to FIGS. 6 and 7.

Figures 6, 7:
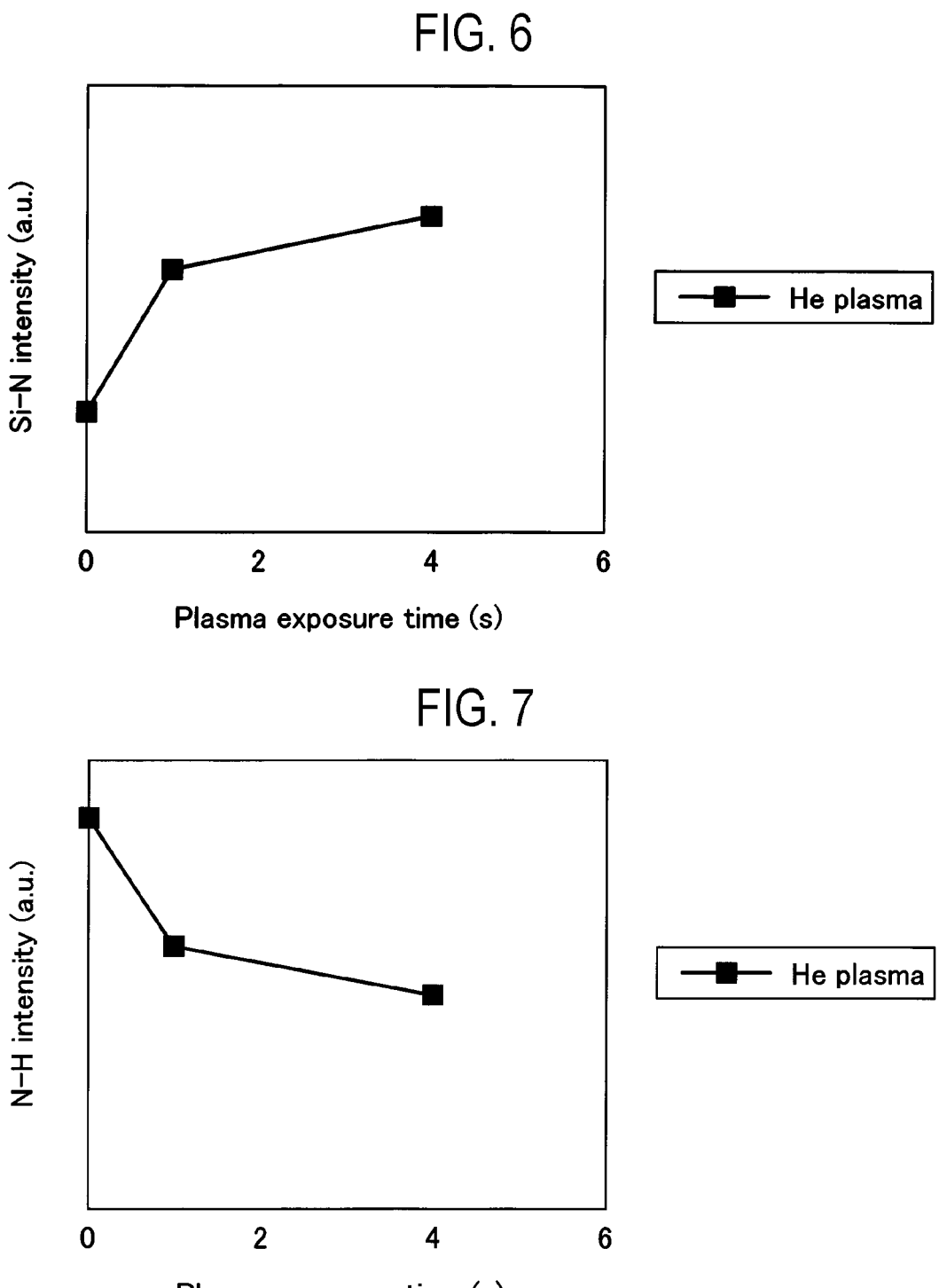
FIG. 6 is a graph showing an example of a dependence of an amount of Si-N bonds contained in the SiN film on a He plasma exposure time in the SiN film of the present example.
FIG. 7 is a graph showing an example of a dependence of an amount of N-H bonds contained in the SiN film on the He plasma exposure time in the SiN film of the present example.

FIG. 6 is a graph showing an example of a dependence of an amount of Si—N bonds contained in the SiN film on a He plasma exposure time in the SiN film of the present example. In FIG. 6, the vertical axis represents the amount of Si—N bonds, and the horizontal axis represents the He plasma exposure time. Here, the amount of Si—N bonds was determined from a peak intensity in an absorption spectrum acquired by Fourier transform infrared spectroscopy. In addition, it has been obtained from the findings so far that the WERR has a negative correlation with the amount of Si—N bonds in the film.

FIG. 7 is a graph showing an example of a dependence of an amount of N—H bonds contained in the SiN film on the He plasma exposure time in the SiN film of the present example. In FIG. 7, the vertical axis represents the amount of N—H bonds, and the horizontal axis represents the He plasma exposure time. Here, the amount of N—H bonds was obtained from a peak intensity in an absorption spectrum acquired by Fourier transform infrared spectroscopy, similarly to the amount of Si—N bonds.

As shown in FIGS. 6 and 7, by the He gas plasma, the amount of N—H bonds in the SiN film is decreased (see FIG. 7) and the amount of Si—N bonds is increased in the SiN film (see FIG. 6), whereby the films were modified to be stronger. This is due to at least one of He ions in plasma and He radicals in the plasma, and light emission (vacuum ultra-violet (VUV)) of plasma containing He in the modification by the He gas plasma Here, the film formation of the SiN films in the present example and the reference example will be further described. In the reference example, after the nitriding process (S303 and S304), the modifying process using the He gas plasma (S306 and S307) is performed. Due to the nitriding process, NH groups or $NH_2$ groups are present on the surface of the base film of the wafer W. Thereafter, when the surface of the base film of the wafer W is irradiated with the He gas plasma, the amount of N—H bonds on the surface decreases.

It is known that the precursor (DCS) in the reference example is adsorbed on the NH groups or the $NH_2$ groups on the surface. Therefore, when the nitriding process (S306 and S307) using the He gas plasma is performed after the nitriding process (S303 and S304), the NH groups or the $NH_2$ groups which are adsorption sites of the precursor (DCS) decrease. As a result, in the reference example, the film formation rate decreases.

On the other hand, in the present example, after the adsorption of the precursor gas (S201) and before the nitriding process (S206 and S207), the modifying process (S203 and S204) using the He gas plasma is performed. In this case, adsorbate of the precursor (DCS), and the NH groups or $NH_2$ groups not consumed by the adsorption are present on the surface of the base film of the wafer W before the modifying process using the He gas plasma.

When the modifying process using the He gas plasma is performed in this state, the excess NH groups or $NH_2$ groups that are not consumed by the adsorption are removed and converted into Si—N bonds. Thereafter, when the nitriding process (S206 and S207) is performed, the side chains of the adsorbate of the precursor (DCS) are replaced with the NH groups or the $NH_2$ groups. Thereafter, the adsorption of the precursor gas (S201) is performed. That is, a film is formed without reducing the NH groups or the $NH_2$ groups, which are the adsorption sites of the precursor (DCS). As a result, in the present example, the film formation rate is maintained.

As a result, in the method of forming the SiN film according to the present example, both improvement of the etching resistance and maintenance of the film formation rate can be achieved.

In the present example, since the film is modified by using the He gas plasma, it is possible to expand an applicable range. Here, in the modifying process using $H_2$ gas or $H_2$ gas plasma, hydrogen may diffuse to the base film of the SiN film to deteriorate device characteristics. In contrast, in the present example, since the film is modified by using the He gas plasma, it is possible to prevent the diffusion of hydrogen into the base film of the SiN film, and to expand the applicable range.

In the foregoing, the film forming method of the present embodiment using the substrate processing apparatus 101 has been described. However, the present disclosure is not limited to the above-described embodiment or the like, and may be variously modified and improved within the scope of the present disclosure described in the claims.

In the processing apparatus 101, DCS is described as being used as the precursor gas and the $NH_3$ gas is described as being used as the reaction gas, but the present disclosure is not limited thereto. As the precursor gas, a silicon-containing gas such as a $SiH_4$ gas, a trisilylamine (TSA) gas, a silicon-based gas containing halogen, or an aminosilane gas may be used. As the reaction gas, a gas such as a $NH_3$ gas, a $N_2$ gas or the like may be used. When the $SiH_4$ gas is used as the precursor gas, the $N_2$ gas may be used as the reaction gas. In addition, the SiN film may be formed by ALD using heat without using plasma. In this case, a gas such as $NH_3$, hydrazine, hydrazine derivative or the like may be used as the reaction gas.

The present application claims priority based on Japanese Patent Application No. 2019-209033 filed on Nov. 19, 2019, the disclosure of which is incorporated herein in its entirety by reference

EXPLANATION OF REFERENCE NUMERALS

101: substrate processing apparatus, W: wafer, 1: processing container, 2: stage, 3: shower head, 4: exhauster, 5: gas supply mechanism (gas source), 51*a*: precursor gas source, 52*a*: a reaction gas source, 53*a*: Ar gas source, 54*a*: Ar gas source, 55*a*: He gas source, 8: RF power supply (radio-frequency power supply), 83: radio-frequency power source, 9: controller

What is claimed is:

1. A substrate processing method comprising:
    (a) forming an adsorption layer on a substrate by supplying a silicon-containing gas to the substrate;
    (b) after (a), modifying the adsorption layer by plasma of He gas; and
    (c) after (b), nitriding the modified adsorption layer by causing the modified adsorption layer to react with plasma of a nitrogen-containing reaction gas,
    wherein (a), (b), and (c) are repeated to form a silicon nitride film.

2. The substrate processing method of claim 1, further comprising:
    purging the silicon-containing gas between (a) and (b).

3. The substrate processing method of claim 2, wherein, in (b) the adsorption layer, the adsorption layer is modified by being exposed to at least one of He ions in the plasma, He radicals in the plasma, and a light emission of the plasma containing He.

4. The substrate processing method of claim 3, wherein (b) improves an etching resistance of the silicon nitride film.

5. The substrate processing method of claim 3, wherein the silicon-containing gas includes at least one gas selected from a group consisting of a DCS gas, a $SiH_4$ gas, a trisilylamine (TSA) gas, a silicon-based gas containing a halogen, and an aminosilane gas.

6. The substrate processing method of claim 5, wherein the reaction gas includes at least one gas selected from a group consisting of a $NH_3$ gas, a $N_2$ gas, hydrazine, and a hydrazine derivative gas.

7. The substrate processing method of claim 1, wherein, in (b), the adsorption layer is modified by being exposed to at least one of He ions in the plasma, He radicals in the plasma, and a light emission of the plasma containing He.

8. The substrate processing method of claim 1, wherein (b) improves an etching resistance of the silicon nitride film.

9. The substrate processing method of claim 1, wherein the silicon-containing gas includes at least one gas selected from a group consisting of a DCS gas, a $SiH_4$ gas, a trisilylamine (TSA) gas, a silicon-based gas containing a halogen, and an aminosilane gas.

10. The substrate processing method of claim 1, wherein the reaction gas includes at least one gas selected from a group consisting of a $NH_3$ gas, a $N_2$ gas, hydrazine, and a hydrazine derivative gas.

* * * * *